(12) United States Patent
Maeda et al.

(10) Patent No.: US 11,996,355 B2
(45) Date of Patent: May 28, 2024

(54) SEMICONDUCTOR DEVICE AND METHOD FOR MANUFACTURING SEMICONDUCTOR DEVICE

(71) Applicant: Mitsubishi Electric Corporation, Tokyo (JP)

(72) Inventors: Atsushi Maeda, Tokyo (JP); Tatsuya Kawase, Tokyo (JP); Yuji Imoto, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 312 days.

(21) Appl. No.: 17/632,503

(22) PCT Filed: Oct. 17, 2019

(86) PCT No.: PCT/JP2019/040828
§ 371 (c)(1),
(2) Date: Feb. 2, 2022

(87) PCT Pub. No.: WO2021/075016
PCT Pub. Date: Apr. 22, 2021

(65) Prior Publication Data
US 2022/0285254 A1 Sep. 8, 2022

(51) Int. Cl.
*H01L 23/053* (2006.01)
*H01L 21/52* (2006.01)
*H01L 23/498* (2006.01)

(52) U.S. Cl.
CPC ........ *H01L 23/49805* (2013.01); *H01L 21/52* (2013.01); *H01L 23/49811* (2013.01); *H01L 23/49838* (2013.01)

(58) Field of Classification Search
CPC ......... H01L 23/49811; H01L 23/49838; H01L 23/053
See application file for complete search history.

(56) References Cited

U.S. PATENT DOCUMENTS

2005/0287700 A1* 12/2005 Huang ................ H01L 25/0652
257/E25.011
2011/0291106 A1   12/2011 Kikuchi
(Continued)

FOREIGN PATENT DOCUMENTS

JP   S53-015762 A   2/1978
JP   2008-182074 A   8/2008
(Continued)

OTHER PUBLICATIONS

An Office Action; "Notice of Reasons for Refusal," mailed by the Japanese Patent Office dated Aug. 23, 2022, which corresponds to Japanese Patent Application No. 2021-552053 and is related to U.S. Appl. No. 17/632,503; with English language translation.
(Continued)

*Primary Examiner* — Michele Fan
(74) *Attorney, Agent, or Firm* — Studebaker & Brackett PC

(57) ABSTRACT

A semiconductor device includes a semiconductor element and a lead part. The semiconductor element is mounted on a circuit pattern provided on an insulating substrate. The lead part has a plate shape and is bonded to the semiconductor element with a first bonding material interposed therebetween. The lead part includes a lead body and a bonding component. The lead body includes an opening part provided corresponding to a mounting position of the semiconductor element. The bonding component is provided in the opening part and on the semiconductor element. The bonding component is bonded at a lower surface thereof to the semiconductor element by the first bonding material and bonded at an outer peripheral part thereof to an inner periphery of the opening part by a second bonding material.

13 Claims, 12 Drawing Sheets

(56) References Cited

U.S. PATENT DOCUMENTS

| | | |
|---|---|---|
| 2013/0299962 A1 | 11/2013 | Ide et al. |
| 2016/0035646 A1 | 2/2016 | Soyano |
| 2019/0131213 A1 | 5/2019 | Iizuka et al. |

FOREIGN PATENT DOCUMENTS

| | | |
|---|---|---|
| JP | 2011-253862 A | 12/2011 |
| JP | 2012-043956 A | 3/2012 |
| JP | 2013-239486 A | 11/2013 |
| JP | 2017-069581 A | 4/2017 |
| WO | 2017/208430 A1 | 12/2017 |

OTHER PUBLICATIONS

International Search Report issued in PCT/JP2019/040828; dated Nov. 19, 2019.

\* cited by examiner

F I G. 9
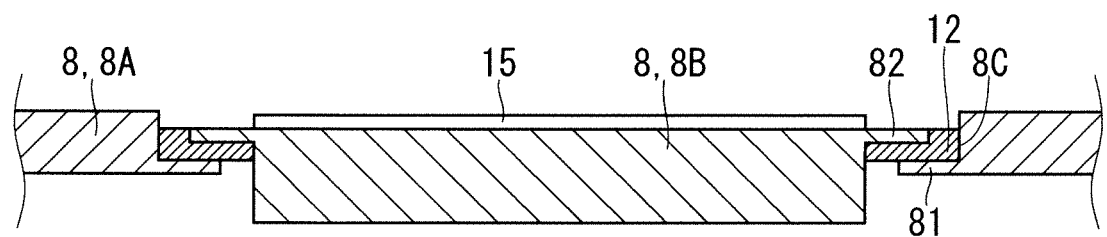

F I G. 1 0
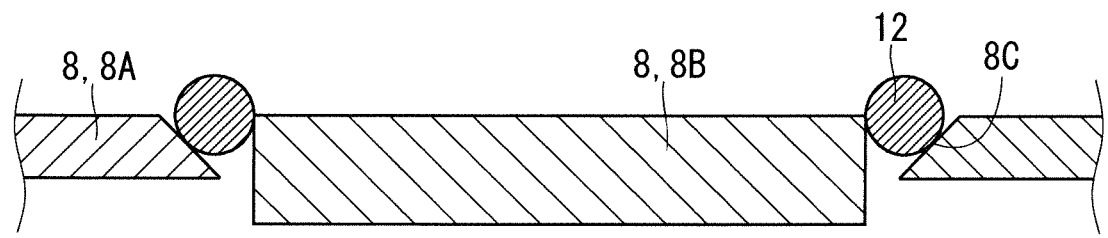

SEMICONDUCTOR DEVICE AND METHOD FOR MANUFACTURING SEMICONDUCTOR DEVICE

TECHNICAL FIELD

The present invention relates to a semiconductor device and a method for manufacturing the semiconductor device.

BACKGROUND ART

A semiconductor device having a direct lead bonding (DLB) structure is known as a structure for directly soldering a lead frame to a semiconductor element. In this kind of semiconductor device, a clearance between the lead frame and the semiconductor element affects a bonding state and further affects the reliability of the semiconductor device.

Patent Document 1 proposes a structure in which, even if there is unevenness in height of bonding points between the external lead and metal foil due to deformation such as warping or twisting of the lead frame, the metal foil having a small spring constant absorbs the unevenness and make an applied load uniform, and the amount of solder can be kept constant.

PRIOR ART DOCUMENTS

Patent Documents

Patent Document 1: Japanese Patent Application Laid-Open No. 53-015762

SUMMARY

Problem to be Solved by the Invention

In a semiconductor device having the DLB structure, the clearance between the lead part and the semiconductor element is affected by warpage of an insulating circuit board and a base plate arranged below the semiconductor element at the time of bonding, that is, heating. The warpage occurs because the linear expansion coefficient of each member is different from the others. If the warpage becomes large at the time of bonding, a gap is generated between the lead part and the semiconductor element, or the bonding area between the two becomes insufficient. As a result, the reliability of the bonding part between the lead part and the semiconductor element is lowered.

The present invention has been made to solve the above problem, and an object of the present invention is to provide a semiconductor device having improved bonding reliability between a lead part and a semiconductor element.

Means to Solve the Problem

The semiconductor device according to the present invention includes a semiconductor element and a lead part. The semiconductor element is mounted on a circuit pattern provided on an insulating substrate. The lead part has a plate shape and is bonded to the semiconductor element with a first bonding material interposed therebetween. The lead part includes a lead body and a bonding component. The lead body includes an opening part provided corresponding to a mounting position of the semiconductor element. The bonding component is provided in the opening part and on the semiconductor element. The bonding component is bonded at a lower surface thereof to the semiconductor element by the first bonding material and bonded at an outer peripheral part thereof to an inner periphery of the opening part by a second bonding material.

Effects of the Invention

According to the present invention, the semiconductor device having improved bonding reliability between the lead part and the semiconductor element can be provided.

The objects, features, aspects and advantages of the present invention will become more apparent from the following detailed description and the accompanying drawings.

BRIEF DESCRIPTION OF DRAWINGS

FIG. 9 is a cross-sectional view showing the opening part of the lead body and the bonding component after bonding in the third embodiment.

FIG. 10 is a cross-sectional view showing the opening part of the lead body and the bonding component before bonding in a fourth embodiment.

DESCRIPTION OF EMBODIMENTS

First Embodiment

Figure 1:
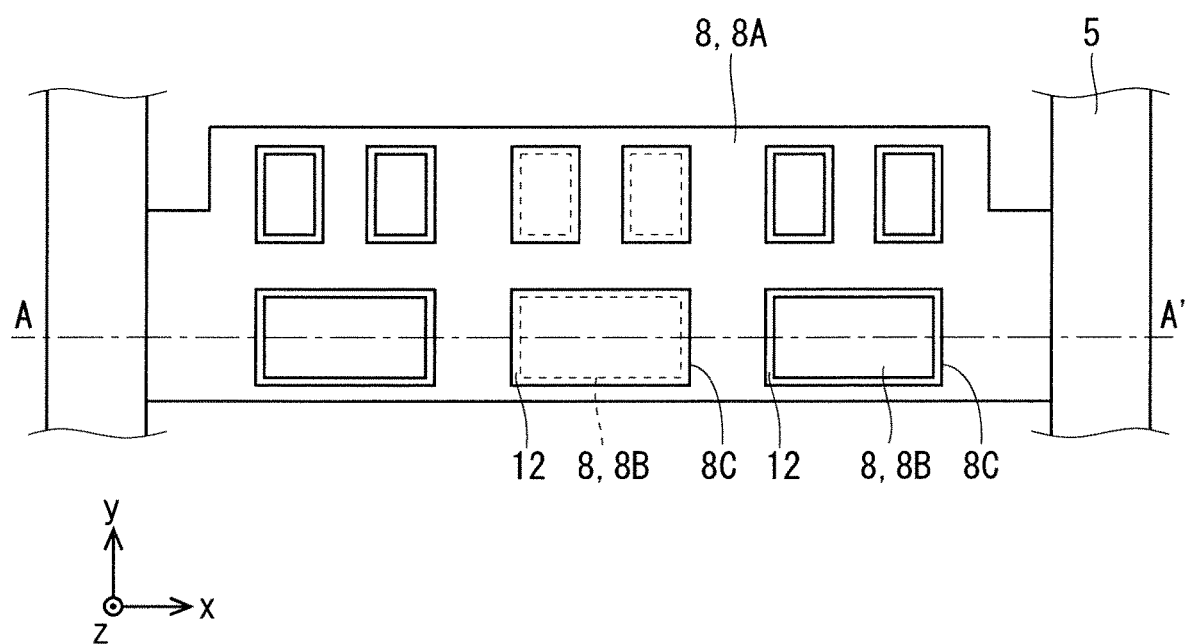
FIG. 1 is a top view showing a configuration of a semiconductor device according to a first embodiment.
Figure 2:
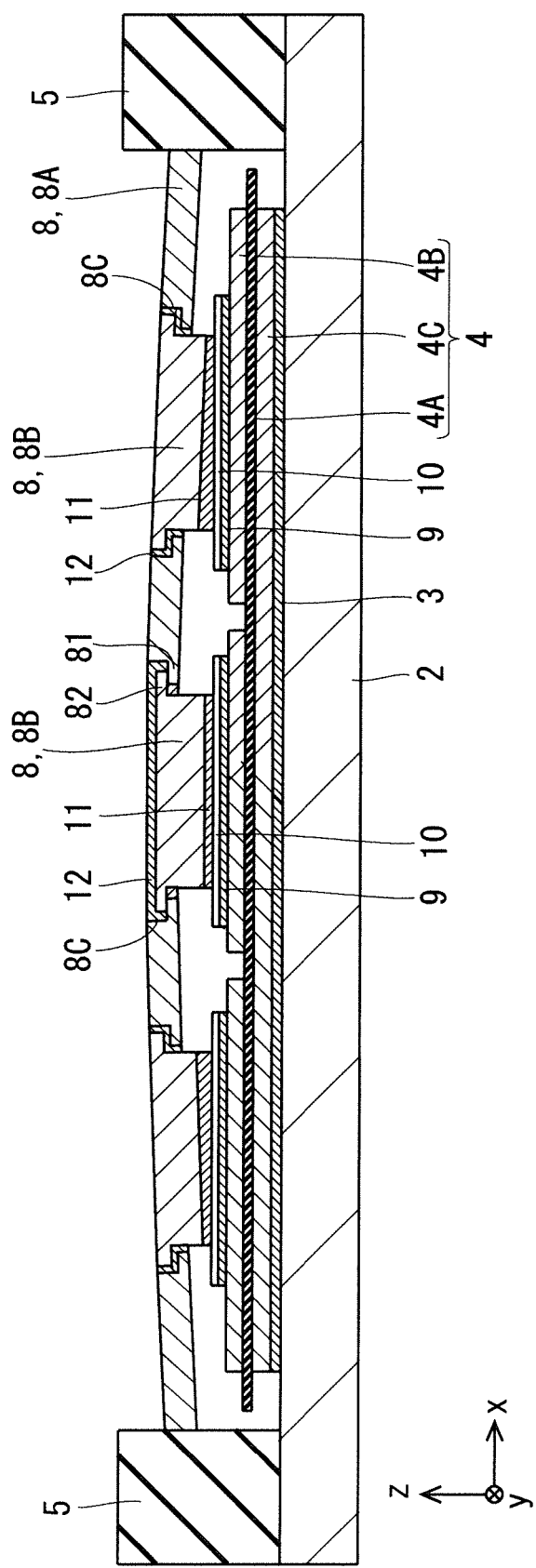
FIG. 2 is a cross-sectional view showing the configuration of the semiconductor device according to the first embodiment.

FIG. 1 is a top view showing a configuration of a semiconductor device according to a first embodiment. FIG. 2 is a cross-sectional view showing the configuration of the semiconductor device according to the first embodiment, and showing a cross section taken along A-A' in FIG. 1.

The semiconductor device includes a base plate 2, an insulating circuit board 4, a case 5, a lead part 8, and a semiconductor element 10.

The base plate 2 has a plate shape with flat front and back surfaces, and is formed of, for example, Cu, Al or AlSiC. Pin fins or the like for improving the cooling performance of the semiconductor device may be provided on the back surface of the base plate 2.

The insulating circuit board 4 includes an insulating substrate 4A and circuit patterns 4B and 4C. The circuit patterns 4B and 4C are formed on the front surface and the back surface of the insulating substrate 4A, respectively. The back surface of the insulating circuit board 4 is fixed to the front surface of the base plate 2 by solder 3. Here, the circuit pattern 4C on the back surface side is bonded to the base plate 2. Because the circuit pattern 4B on the front surface side constitutes an electric circuit, the coverage rate to the insulating substrate 4A is lower than that of the circuit pattern 4C on the back surface side. The insulating substrate 4A is formed of, for example, $Al_2O_3$, AlN, or $Si_3N_4$. The circuit pattern 4B on the front surface side and the circuit pattern 4C on the back surface side are formed of, for example, Al or Cu.

The semiconductor element 10 is mounted on the circuit pattern 4B on the front surface side. In the first embodiment, a plurality of the semiconductor elements 10 are fixed on the insulating circuit board 4 with solder 9 interposed therebetween. The semiconductor element 10 is formed of, for example, a semiconductor such as Si or a so-called wide bandgap semiconductor such as SiC or GaN. The semiconductor element 10 is, for example, an Insulated Gate Bipolar Transistor (IGBT), a Metal Oxide Semiconductor Field Effect Transistor (MOSFET), a Schottky barrier diode, or the like. The semiconductor element 10 is, for example, a power semiconductor element.

The lead part 8 is a conductor having a plate shape. The lead part 8 includes a lead body 8A and a bonding component 8B.

The lead body 8A includes an opening part 8C provided corresponding to the mounting position of the semiconductor element 10. The opening part 8C is a through hole. The opening part 8C according to the first embodiment includes, on the inner periphery thereof, a first step part 81 protruding inward of the opening part 8C. The back surface of the first step part 81 is flush with the back surface of the lead body 8A. Therefore, the size of the opening part 8C on the front surface side is larger than that on the back surface side. The lead body 8A is formed of, for example, Cu or Al.

The bonding component 8B is provided in the opening part 8C of the lead body 8A and on the semiconductor element 10. The lower surface of the bonding component 8B is bonded to the front surface of the semiconductor element 10 by a first bonding material 11. The first bonding material 11 is, for example, solder. Further, the bonding component 8B according to the first embodiment includes a second step part 82 protruding outward of the outer peripheral part. The upper surface of the second step part 82 is flush with the upper surface of the bonding component 8B. Therefore, the outer shape of the bonding component 8B on the upper surface side is larger than that on the lower surface side. Further, the outer shape of the bonding component 8B including the second step part 82 is larger than the outer shape of the opening part 8C including the first step part 81 of the lead body 8A. The first step part 81 of the lead body 8A is arranged so as to face the second step part 82 of the bonding component 8B. The first step part 81 and the second step part 82 are bonded to each other by a second bonding material 12. That is, the outer peripheral part of the bonding component 8B is bonded to the inner periphery of the opening part 8C by the second bonding material 12. The second bonding material 12 is, for example, solder. The bonding component 8B is formed of, for example, Cu or Al.

The case 5 accommodates the insulating substrate 4A on which the semiconductor element 10 is mounted, and holds both ends of the lead part 8. The case 5 has, for example, a frame shape. The back surface of the case 5 is fixed to the outer periphery of the front surface of the base plate 2 by a bonding agent or the like. The case 5 is formed of, for example, polyphenylene sulfide (PPS).

Figure 3:
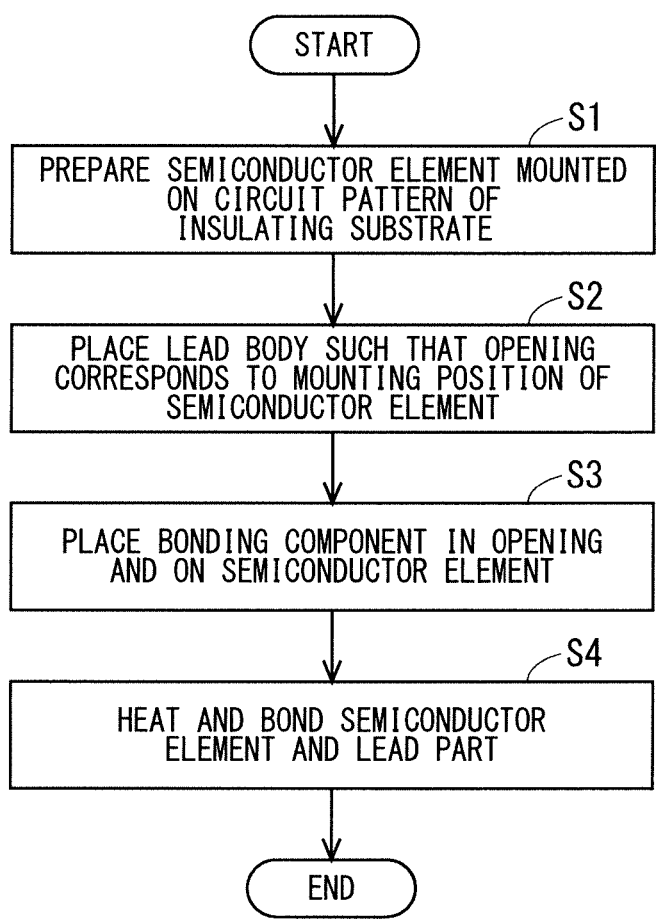
FIG. 3 is a flowchart showing a method for manufacturing the semiconductor device according to the first embodiment.

FIG. 3 is a flowchart showing a method for manufacturing the semiconductor device according to the first embodiment.

In step S1, the semiconductor element 10 mounted on the circuit pattern 4B on the front surface side of the insulating substrate 4A is prepared. At this time, the solder 9 before bonding is formed of, for example, paste-like solder or plate-like solder.

In step S2, the lead body 8A is placed such that the opening part 8C corresponds to the mounting position of the semiconductor element 10.

Figure 4:
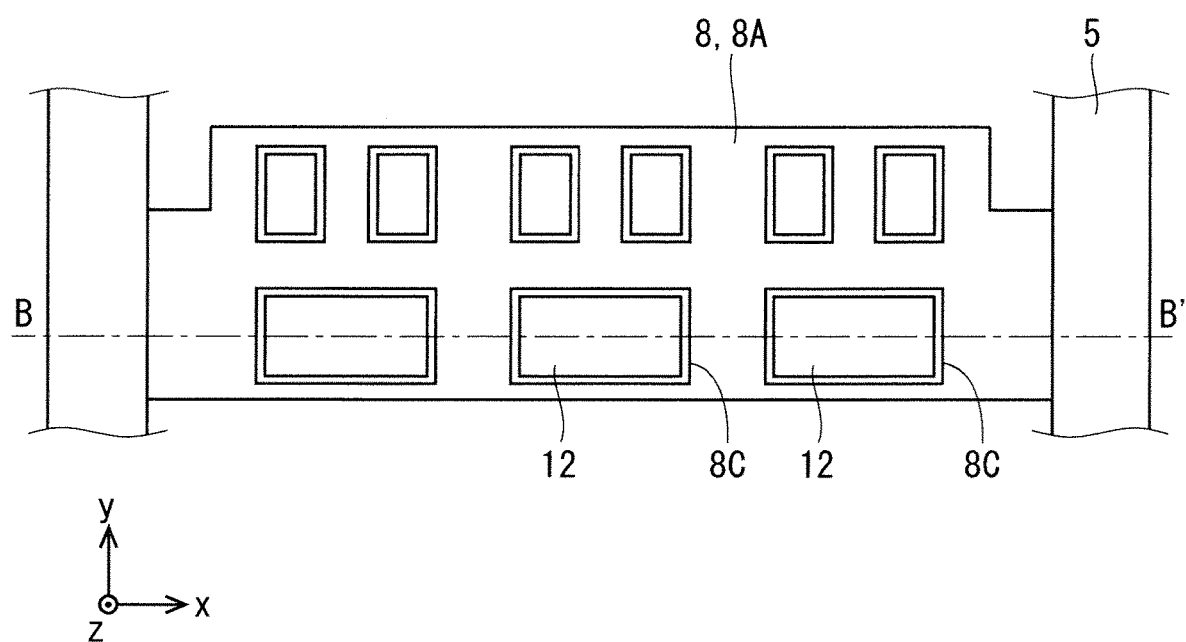
FIG. 4 is a top view showing the configuration of the semiconductor device in the middle of manufacturing according to the first embodiment.
Figure 5:
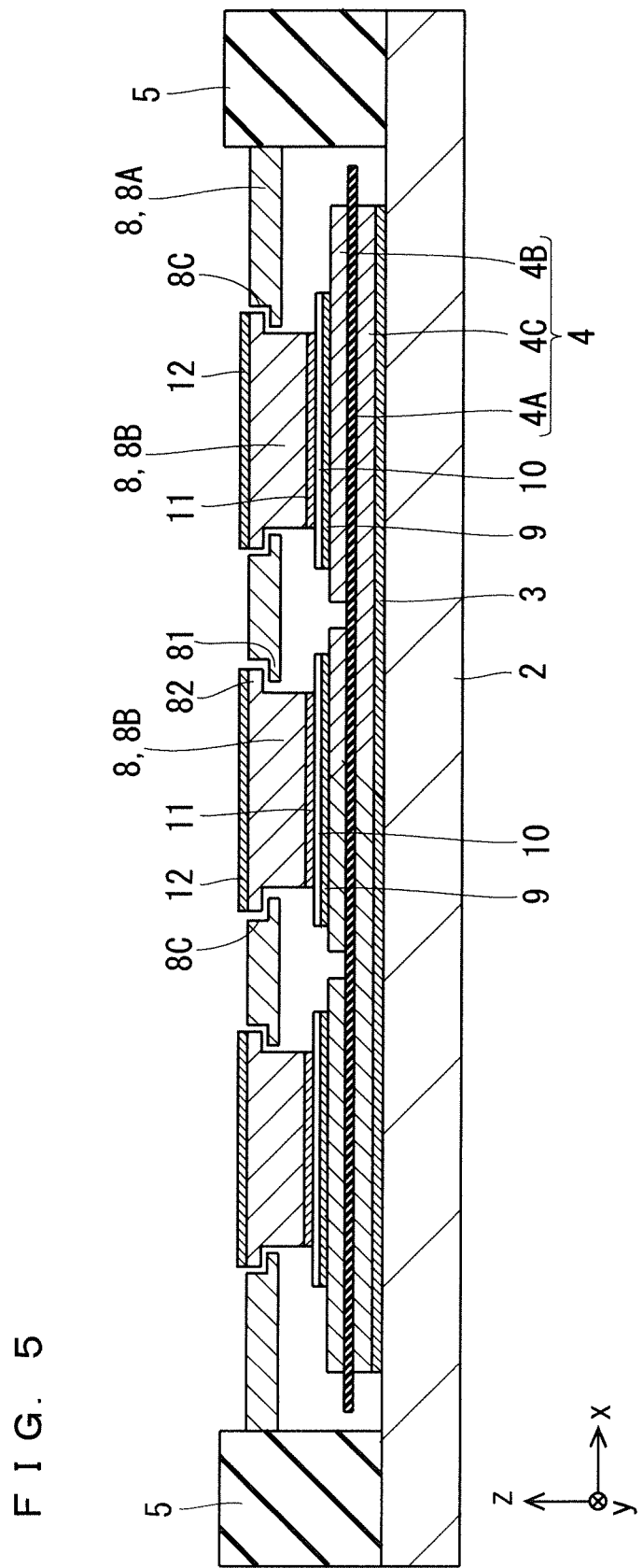
FIG. 5 is a cross-sectional view showing the configuration of the semiconductor device in the middle of manufacturing according to the first embodiment.

In step S3, the bonding component 8B is placed in the opening part 8C and on the semiconductor element 10. FIG. 4 is a top view showing the configuration of the semiconductor device in step S3. FIG. 5 is a cross-sectional view showing the configuration of the semiconductor device in step S3, and shows a cross section along B-B' in FIG. 4. At this time, the first bonding material and the second bonding material before bonding are formed of, for example, paste-like solder or plate-like solder. Here, the second bonding material before bonding is applied to the upper surface of the bonding component 8B.

Figure 6:
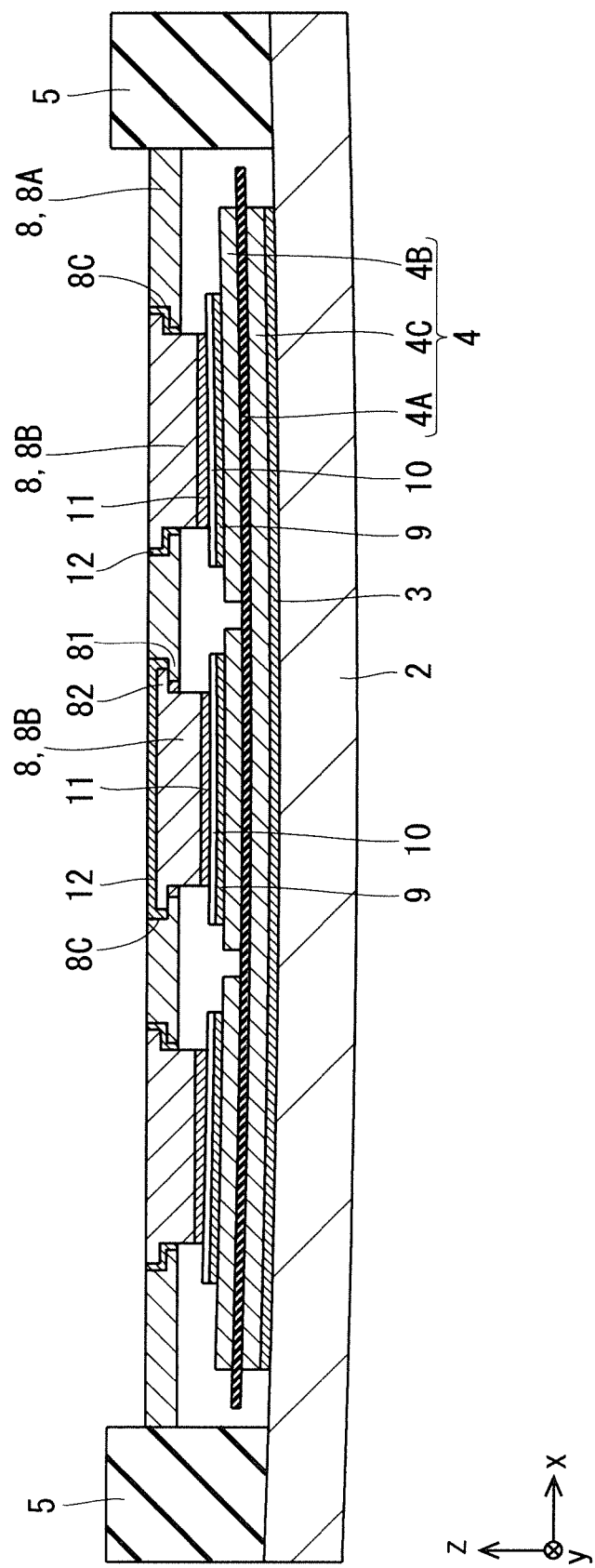
FIG. 6 is a cross-sectional view showing a state of the semiconductor device at high temperature in a method for manufacturing the semiconductor device according to the first embodiment.

In step S4, the semiconductor element 10 and the lead part 8 are heated. FIG. 6 is a cross-sectional view showing a state of the semiconductor device at high temperature in step S4. Because the linear expansion coefficient of each member is different from the others, warpage occurs at the time of bonding. For example, the semiconductor device warps in a downwardly convex shape as shown in FIG. 6. Here, a state in which the structure from the semiconductor element 10 to the base plate 2 is warped in a downwardly convex shape and the lead part 8 held in the case 5 is not warped is described as an example. Due to the occurrence of the warpage like this, the position of the semiconductor element 10 with respect to the lead part 8 in the z direction changes. Because the bonding component 8B is not fixed to the lead body 8A and is movable during heating, the bonding component 8B moves in the direction of the semiconductor element 10 so as to follow the warpage, that is, the bonding component 8B moves in the z direction following the displacement of the semiconductor element 10. Therefore, the bonding component 8B and the semiconductor element 10 are brought into close contact with each other with the first bonding material interposed therebetween. Further, the second bonding material 12 on the upper surface of the bonding component 8B melts and flows into the outer peripheral part of the bonding component 8B and the inner periphery of the opening part 8C of the lead body 8A. As a result, the outer peripheral part of the bonding component 8B and the inner periphery of the opening part 8C are brought into close contact with each other with the second bonding material 12 interposed therebetween.

The state of the semiconductor device after cooling is as shown in FIG. 2. The structure from the semiconductor element 10 to the base plate 2 returns to a flat state. The lead part 8 is curved upward in a convex shape, but because the lead part 8 has a thin plate shape, this deformation is allowed. The bonding component 8B is stably bonded to the semiconductor element 10 without having a gap formed between the lower surface of the bonding component 8B and the semiconductor element 10. Further, the outer peripheral part of the bonding component 8B is also stably bonded to the inner periphery of the opening part 8C of the lead body 8A.

Summarizing the above, the semiconductor device according to the first embodiment includes the semiconductor element 10 and the lead part 8. The semiconductor element 10 is mounted on the circuit pattern 4B provided on the insulating substrate 4A. The lead part 8 has a plate shape and is bonded to the semiconductor element 10 with the first bonding material 11 interposed therebetween. The lead part 8 includes the lead body 8A and the bonding component 8B. The lead body 8A includes an opening part 8C provided corresponding to the mounting position of the semiconductor element 10. The bonding component 8B is provided in the opening part 8C and on the semiconductor element 10. The bonding component 8B is bonded at the lower surface thereof to the semiconductor element 10 by the first bonding material 11 and bonded at the outer peripheral part thereof to the inner periphery of the opening part 8C by the second bonding material 12.

Further, the semiconductor device according to the first embodiment includes the case 5. The case 5 accommodates the insulating substrate 4A on which the semiconductor element 10 is mounted, and holds both ends of the lead part 8.

With this configuration, the bonding reliability between the lead part 8 and the semiconductor element 10 is improved. In particular, in the case of bonding the plurality of semiconductor elements 10 to the long lead part 8, the semiconductor element 10 arranged on the center side of the lead part 8 undergoes a large amount of displacement in the z direction during heating. Even in this situation, the semiconductor element 10 is stably bonded to the lead part 8 by the bonding component 8B following the warpage, and a sufficient bonding area is secured. In addition, the assemblability of the semiconductor device is also improved.

In the first embodiment, the semiconductor device in which three semiconductor elements 10 are bonded to one lead part 8 is shown as an example, but the present invention is not limited to this configuration. The semiconductor device may include a configuration in which one or two semiconductor elements are bonded to one lead part 8, or a configuration in which four or more semiconductor elements are bonded to one lead part 8.

Further, the method for manufacturing the semiconductor device according to the first embodiment includes: the step of preparing the semiconductor element 10 mounted on the circuit pattern 4B provided on the insulating substrate 4A; and the step of bonding the lead part 8 having a plate shape to the semiconductor element 10 with the first bonding material 11 interposed therebetween. The step of bonding the lead part 8 to the semiconductor element 10 includes: the step of placing the lead body 8A including the opening part 8C such that the opening part 8C corresponds to the mounting position of the semiconductor element 10; the step of placing the bonding component 8B in the opening part 8C and on the semiconductor element 10; and the step of heating the semiconductor element 10 and the lead part 8 to bond the lower surface of the bonding component 8B to the semiconductor element 10 by the first bonding material 11, and to bond the outer peripheral part of the bonding component 8B to the inner periphery of the opening part 8C by the second bonding material 12.

The above method for manufacturing the semiconductor device enables manufacturing of a semiconductor device in which the bonding reliability between the lead part 8 and the semiconductor element 10 is improved. In the case where the droplet method using molten solder is adopted for bonding the lead part 8 and the semiconductor element 10, the influence of the warpage of the semiconductor device that occurs when the lead part 8 and the semiconductor element 10 are bonded does not become the problem. This is because the droplet method can supply a sufficient amount of solder. However, in order to reduce the number of manufacturing steps, it is preferable that the bonding of the base plate 2 and the insulating circuit board 4, the bonding of the insulating circuit board 4 and the semiconductor element 10, and the bonding of the semiconductor element 10 and the lead part 8 can be performed at the same time. For that purpose, the first bonding material 11 and the second bonding material 12 are preferably paste-like solder or plate-like solder. However, because the amount of paste-like solder or plate-like solder supplied is limited, it is not possible to supply a sufficient amount of solder in consideration of the influence of warpage as with the molten solder. Therefore, handling of the conventional paste-like solder or plate-like solder is difficult for a structure in which the warpage occurs. However, in the first embodiment, because the bonding component 8B of the lead part 8 is movable at the time of bonding, even if the first bonding material 11 and the second bonding material 12 are paste-like solder or plate-like solder, the semiconductor element 10 and the lead part 8 are stably bonded.

Second Embodiment

A semiconductor device according to a second embodiment is described. Note that the descriptions of the same configurations and functions as in the first embodiment are omitted.

Figure 7:
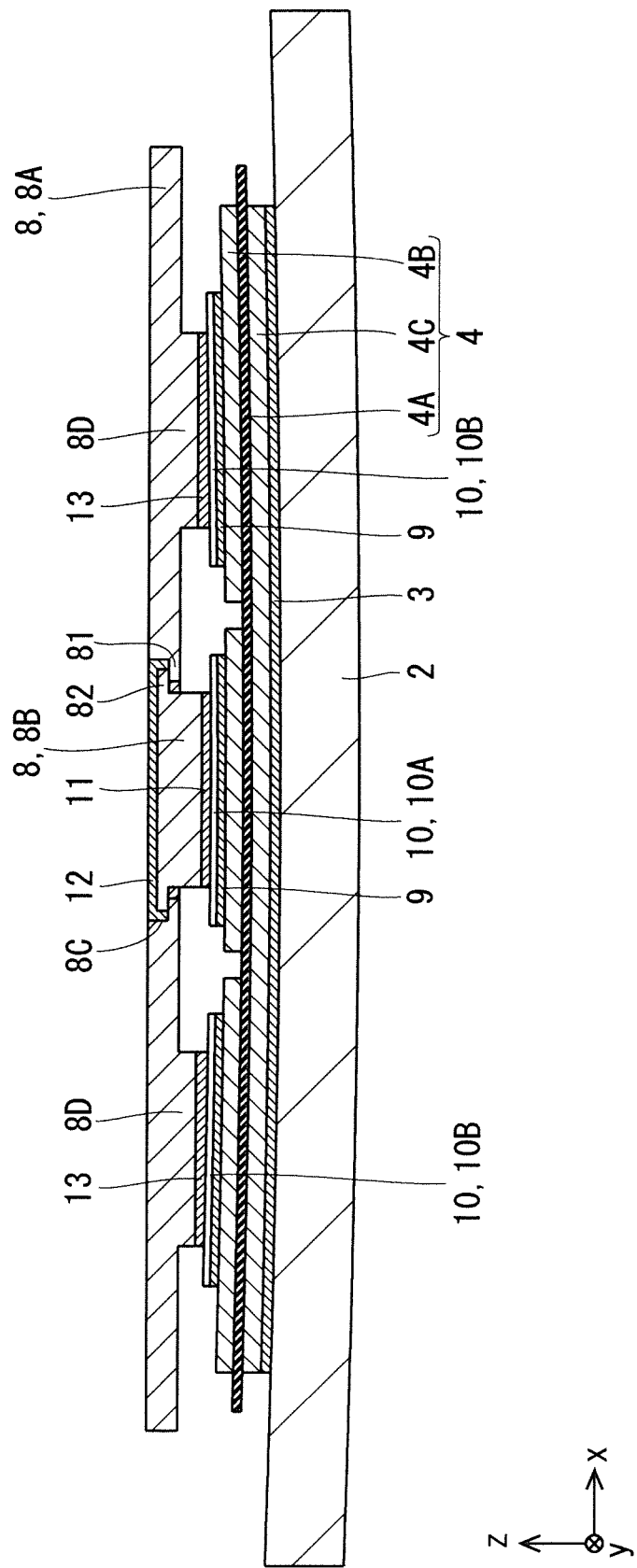
FIG. 7 is a cross-sectional view showing a state of a semiconductor device at high temperature in a method for manufacturing the semiconductor device according to a second embodiment.

FIG. 7 is a cross-sectional view showing the configuration of the semiconductor device according to the second embodiment.

The semiconductor device includes a base plate 2, an insulating circuit board 4, a lead part 8, and a plurality of semiconductor elements 10. The configuration of the base plate 2 and the insulating circuit board 4 is the same as that of the first embodiment.

The plurality of semiconductor elements 10 include one first semiconductor element 10A and two second semiconductor elements 10B. The first semiconductor element 10A is arranged closer to the center side of an insulating substrate 4A than the two second semiconductor elements 10B. The first semiconductor element 10A and the second semiconductor elements 10B are formed of, for example, a semiconductor such as Si or a so-called wide bandgap semiconductor such as SiC or GaN. The first semiconductor element 10A and the second semiconductor element 10B are, for example, IGBTs, MOSFETs, Schottky barrier diodes and the like. The first semiconductor element 10A and the second semiconductor elements 10B are, for example, power semiconductor elements.

The lead part 8 includes a lead body 8A and a bonding component 8B. The lead body 8A includes an opening part 8C and a bonding part 8D. The opening part 8C of the lead body 8A is provided corresponding to the mounting position of the first semiconductor element 10A. The bonding part 8D of the lead body 8A is provided corresponding to the mounting position of the second semiconductor element 10B. The back surface of the bonding part 8D is bonded to the second semiconductor element 10B by a third bonding material 13. The bonding part 8D has, for example, an embossed structure. The third bonding material 13 is, for example, solder. Similarly to the first embodiment, the lower surface of the bonding component 8B provided in the opening part 8C of the lead body 8A and on the first semiconductor element 10A is bonded to the front surface of the first semiconductor element 10A by a first bonding material 11. Further, the outer peripheral part of the bonding component 8B is bonded to the inner periphery of the opening part 8C of the lead body 8A by a second bonding material 12. The lead body 8A and the bonding component 8B are formed of, for example, Cu or Al. Both ends of the lead part 8 in the second embodiment are not held by a case 5.

A method for manufacturing the semiconductor device according to the second embodiment is described. In a heating step of the semiconductor element 10 and the lead part 8, the semiconductor device warps downwardly in a convex shape as shown in FIG. 7 because the linear expansion coefficient of each member is different from the others. Here, as in the first embodiment, a state in which the structure from the semiconductor element 10 to the base plate 2 is warped in a downwardly convex shape is described as an example. In this state, the amount of displacement of the second semiconductor elements 10B located on both end sides of the lead part 8 in the z direction is smaller than the amount of displacement of the first semiconductor element 10A in the z direction. Because both ends of the lead part 8 in the second embodiment are not held by the case 5, not only the bonding component 8B but also the lead body 8A follows the displacement of the semiconductor element 10 due to the warpage. As a result, the second semiconductor elements 10B are stably bonded to the bonding part 8D with the third bonding material 13 interposed therebetween on both end sides of the lead part 8 where the bonding component 8B is not provided. On the other hand, regarding the first semiconductor element 10A undergoing a large amount of displacement in the z direction, because the movable bonding component 8B moves in the z direction so as to follow the displacement, the first semiconductor element 10A is stably bonded to the bonding component 8B with the first bonding material 11 interposed therebetween. At this time, the second bonding material 12 on the upper surface of the bonding component 8B melts and flows between the outer peripheral part of the bonding component 8B and the inner periphery of the opening part 8C of the lead body 8A. Then, the outer peripheral part of the bonding component 8B is bonded to the inner periphery of the opening part 8C of the lead body 8A by the second bonding material 12.

Summarizing the above, the semiconductor device according to the second embodiment includes the first semiconductor element 10A mounted on a circuit pattern 4B provided on the insulating substrate 4A and the second semiconductor element 10B different from the first semiconductor element 10A. The lead body 8A includes the bonding part 8D whose back surface is bonded to the second semiconductor element 10B by the third bonding material 13. The semiconductor element 10A is arranged closer to the center side in the plane of the insulating substrate 4A than the second semiconductor element 10B.

With this configuration, the bonding reliability between the lead part 8 and the semiconductor element 10 is improved as in the first embodiment. Further, even in the case of bonding the plurality of semiconductor elements 10 to the long lead part 8, the number of the bonding components 8B and the opening parts 8C can be reduced. Therefore, the manufacturing cost and the assemblability of the semiconductor device are improved.

Third Embodiment

A semiconductor device and a method for manufacturing the semiconductor device according to a third embodiment are described. The third embodiment is a subordinate concept of the first embodiment, and the semiconductor device according to the third embodiment includes respective configurations of the semiconductor device according to the first embodiment. Note that the descriptions of the same configurations and functions as in the first and second embodiments are omitted.

Figure 8:
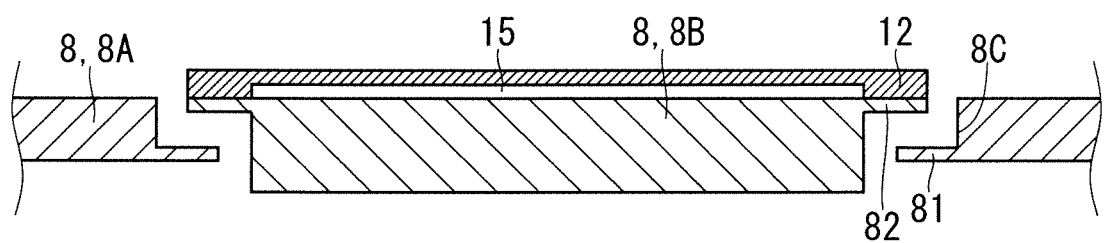
FIG. 8 is a cross-sectional view showing an opening part of a lead body and a bonding component before bonding in a third embodiment.

FIG. 8 is a cross-sectional view showing the opening part 8C and the bonding component 8B of the lead body 8A before bonding in the third embodiment. The lead part 8 includes the lead body 8A and the bonding component 8B as in the first and second embodiments. In the third embodiment, the wettability of the bonding component 8B to the second bonding material 12 in the center part of the upper surface thereof is lower than the wettability to the second bonding material 12 on the outer peripheral part thereof. For example, the bonding component 8B has a wettability control structure 15 in the center part of the upper surface thereof. In other words, the wettability of the wettability control structure 15 to the second bonding material 12 is lower than the wettability in the surroundings of the wettability control structure 15 to the second bonding material 12. The wettability control structure 15 is preferably a resist layer.

In the method for manufacturing the semiconductor device according to the third embodiment, a step of preparing the semiconductor element 10 and a step of placing the lead body 8A are the same as steps S1 and S2 shown in FIG. 3, respectively.

In step S3, the bonding component 8B placed on the semiconductor element 10 includes the second bonding material 12 on the upper surface. The second bonding material 12 is provided on the wettability control structure 15 as shown in FIG. 8. The second bonding material 12 is, for example, paste-like solder or plate-like solder.

In step S4, the semiconductor element 10 and the lead part 8 are heated. When the second bonding material 12 on the upper surface of the bonding component 8B melts, the wettability control structure 15 prevents the second bonding material 12 from gathering in the center part of the upper surface. Therefore, the melted second bonding material 12 easily flows between the outer peripheral part of the bonding component 8B and the inner periphery of the opening part 8C of the lead body 8A. FIG. 9 is a cross-sectional view showing the opening part 8C and the bonding component 8B of the lead body 8A after bonding in the third embodiment. The outer peripheral part of the bonding component 8B is stably bonded to the inner periphery of the opening part 8C of the lead body 8A by the second bonding material 12. Further, although the illustration is omitted in FIG. 9, similarly to the first embodiment, in this step S4, the lower surface of the bonding component 8B is bonded to the semiconductor element 10 by the first bonding material 11.

In the above semiconductor device and the manufacturing method thereof, the ease of bonding the bonding component 8B and the lead body 8A is improved.

Fourth Embodiment

A semiconductor device and a method for manufacturing the semiconductor device according to a fourth embodiment are described. The fourth embodiment is a subordinate concept of the first embodiment, and the semiconductor device according to the fourth embodiment includes respective configurations of the semiconductor device according to the first embodiment. Note that the descriptions of the same configurations and functions as in any of the first to third embodiments are omitted.

FIG. 10 is a cross-sectional view showing the opening part 8C and the bonding component 8B of the lead body 8A before bonding in the fourth embodiment. The lead part 8 includes the lead body 8A and the bonding component 8B as in the first and second embodiments. The lead body 8A according to the fourth embodiment has an upwardly inclined slope on the inner periphery thereof. Further, the bonding component 8B does not include the second step part 82, and the side surface thereof is flat.

In the method for manufacturing the semiconductor device according to the fourth embodiment, a step of preparing the semiconductor element 10, a step of placing the lead body 8A, and a step of placing the bonding component 8B are the same as steps S1, S2, and S3 shown in FIG. 3, respectively.

In step S4, as shown in FIG. 10, before heating the semiconductor element 10 and the lead part 8, the second bonding material 12 is inserted so as to come into contact with the side surface of the outer peripheral part of the bonding component 8B and the slope of the opening part 8C of the lead body 8A. Here, the second bonding material 12 is, for example, thread-like solder. By heating the semiconductor element 10 and the lead part 8, the second bonding material 12 melts and the outer peripheral part of the bonding component 8B is stably bonded to the inner periphery of the opening part 8C of the lead body 8A by the second bonding material 12. Similarly to the first embodiment, in this step S4, the lower surface of the bonding component 8B is bonded to the semiconductor element 10 by the first bonding material 11.

In the above semiconductor device and the manufacturing method thereof, the ease of bonding the bonding component 8B and the lead body 8A is improved. In the fourth embodiment, an example is shown in which the side surface of the opening part 8C of the lead body 8A is the slope, but the present invention is not limited to this, and a vertical surface may be used.

Fifth Embodiment

A semiconductor device and a method for manufacturing the semiconductor device according to a fifth embodiment are described. The fifth embodiment is a subordinate concept of the first embodiment, and the semiconductor device according to the fifth embodiment includes respective configurations of the semiconductor device according to the first embodiment. Note that the descriptions of the same configurations and functions as in any of the first to fourth embodiments are omitted.

Figure 11:
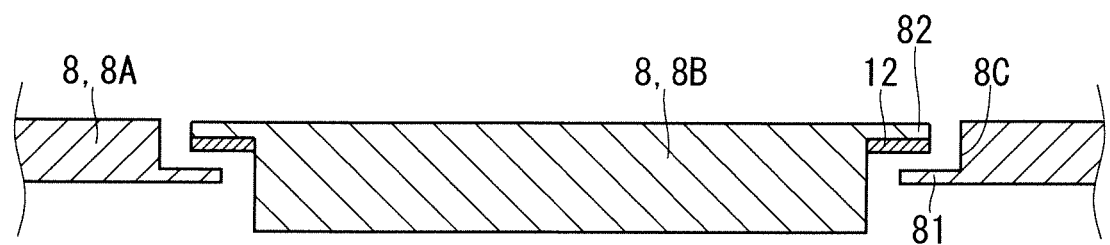
FIG. 11 is a cross-sectional view showing the opening part of the lead body and the bonding component before bonding in a fifth embodiment.

FIG. 11 is a cross-sectional view showing the opening part 8C and the bonding component 8B of the lead body 8A before bonding in the fifth embodiment. The lead part 8 includes the lead body 8A and the bonding component 8B as in the first embodiment. Further, as in the first embodiment, the lead body 8A includes the first step part 81 protruding inward of the opening part 8C from the inner periphery of the opening part 8C, and the bonding component 8B includes the second step part 82 protruding outward of the outer peripheral part thereof.

In the method for manufacturing the semiconductor device according to the fifth embodiment, a step of preparing the semiconductor element 10 and a step of placing the lead body 8A are the same as steps S1 and S2 shown in FIG. 3, respectively.

In step S3, as shown in FIG. 11, the bonding component 8B placed on the semiconductor element 10 includes the second bonding material 12 applied in advance to the contact surface of the second step part 82. The second bonding material 12 is, for example, paste-like solder or plate-like solder. No bonding material is provided on the contact surface of the first step part 81, which is arranged to face the contact surface of the second step part 82.

In step S4, the semiconductor element 10 and the lead part 8 are heated. The melted second bonding material 12 easily bonds the contact surface of the second step part 82 and the contact surface of the first step part 81 to each other. That is, the outer peripheral part of the bonding component 8B is bonded to the inner periphery of the opening part 8C of the lead body 8A by the second bonding material 12. Further, although the illustration is omitted in FIG. 11, similarly to the first embodiment, in this step S4, the lower surface of the bonding component 8B is bonded to the semiconductor element 10 by the first bonding material 11.

In the above semiconductor device and the manufacturing method thereof, the ease of bonding the bonding component 8B and the lead body 8A is improved.

Sixth Embodiment

A semiconductor device and a method for manufacturing the semiconductor device according to a sixth embodiment are described. The semiconductor device according to the sixth embodiment includes respective configurations of the semiconductor device according to the first embodiment. Note that the descriptions of the same configurations and functions as in any of the first to fifth embodiments are omitted.

The lead part 8 includes the lead body 8A and the bonding component 8B as in the first and second embodiments. The heat capacity of the bonding component 8B in the sixth embodiment is smaller than the heat capacity of the lead body 8A. For example, the bonding component 8B and the lead body 8A are made of different metals from each other.

With this configuration, in step S4 shown in FIG. 3, the temperature of the bonding component 8B rises faster, and heat is easily transferred to the first bonding material 11 and the second bonding material 12. Therefore, the ease of bonding the semiconductor element 10, the bonding component 8B, and the lead body 8A is improved.

Seventh Embodiment

A semiconductor device and a method for manufacturing the semiconductor device according to a seventh embodiment are described. Note that the descriptions of the same configurations and functions as in any of the first to sixth embodiments are omitted.

Figure 12:
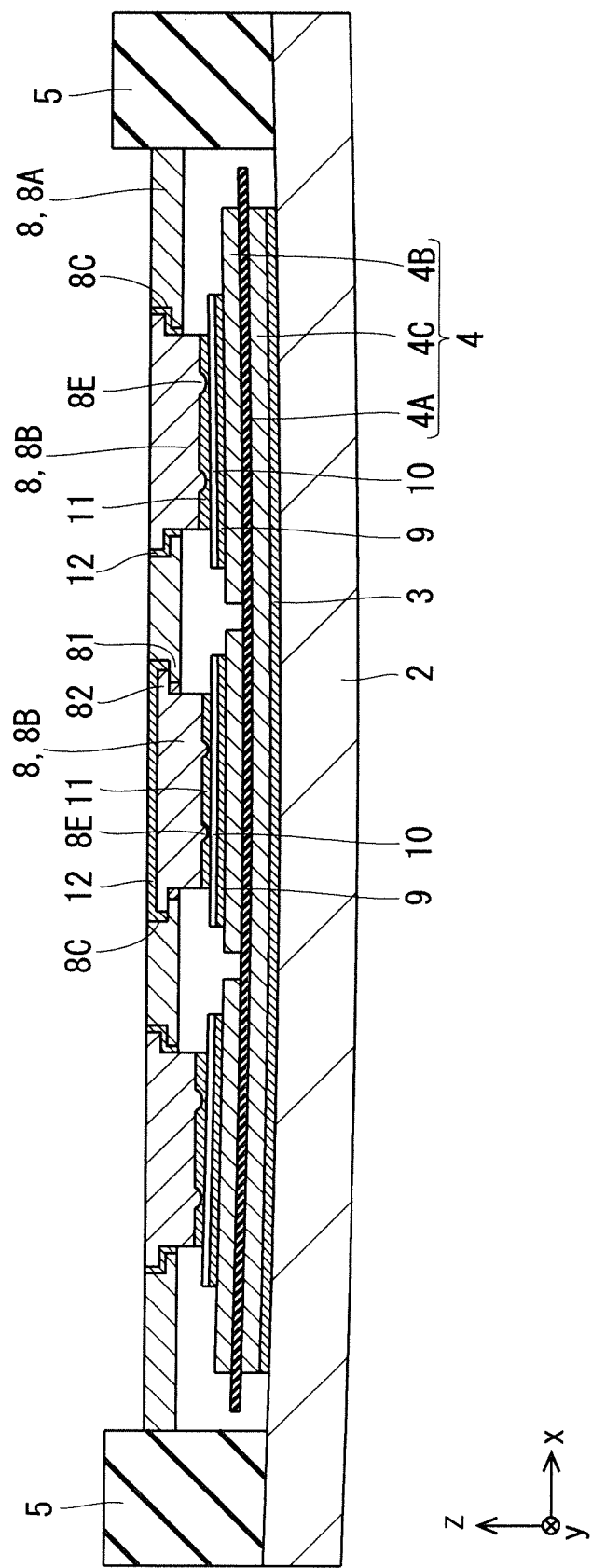
FIG. 12 is a cross-sectional view showing a state of a semiconductor device at high temperature in a method for manufacturing the semiconductor device according to a seventh embodiment.

FIG. 12 is a cross-sectional view showing a state of the semiconductor device at high temperature in the method for manufacturing the semiconductor device according to the seventh embodiment. The lead part 8 includes the lead body 8A and the bonding component 8B as in the first and second embodiments. The bonding component 8B in the seventh embodiment includes a minute protruding part 8E protruding from the contact surface with the second bonding material 12, that is, the lower surface. The minute protruding part 8E is formed by dowel processing.

With this configuration, a constant thickness corresponding to the minute protruding part 8E is secured in the second bonding material 12. Therefore, the assemblability of the semiconductor device is improved.

It should be noted that in the present invention, each of the embodiments can be freely combined, and each of the embodiments can be appropriately modified and omitted, within the scope of the present invention.

Although the present invention has been described in detail, the above description is illustrative in all aspects, and the present invention is not limited thereto. It is understood that countless variations that are not illustrated can be envisaged without departing from the scope of the present invention.

EXPLANATION OF REFERENCE SIGNS

2: base plate
3: solder
4: insulating circuit board
4A: insulating substrate
4B: circuit pattern
4C: circuit pattern
5: case
8: lead part
8A: lead body
8B: bonding component
8C: opening part
8D: bonding part
8E: minute protruding part
9: solder
10: semiconductor element
10A: first semiconductor element
10B: second semiconductor element
11: first bonding material
12: second bonding material
13: third bonding material
15: wettability control structure
81: first step part
82: second step part

The invention claimed is:

1. A semiconductor device comprising:
a semiconductor element mounted on a circuit pattern provided on an insulating substrate; and
a lead part that has a plate shape and is bonded to the semiconductor element with a first bonding material interposed between the lead part and the semiconductor element, wherein
the lead part includes:
a lead body including an opening part provided corresponding to a mounting position of the semiconductor element; and
a bonding component provided in the opening part and on the semiconductor element, and
the bonding component is bonded at a lower surface of the bonding component to the semiconductor element by the first bonding material and bonded at an outer peripheral part of the bonding component to an inner periphery of the opening part by a second bonding material.

2. The semiconductor device according to claim 1, further comprising a case that accommodates the insulating substrate mounted with the semiconductor element and holds both ends of the lead part.

3. The semiconductor device according to claim 1, further comprising another semiconductor element mounted on the circuit pattern of the insulating substrate, wherein
the lead body further includes a bonding part whose back surface is bonded to the other semiconductor element by a third bonding material, and
the semiconductor element is arranged closer to a center side in a plane of the insulating substrate than the other semiconductor element.

4. The semiconductor device according to claim 1, wherein the bonding component has wettability to the second bonding material in a center part of an upper surface of the bonding component lower than the wettability to the second bonding material on the outer peripheral part of the bonding component.

5. The semiconductor device according to claim 4, wherein the bonding component includes a resist layer in the center part of the upper surface.

6. The semiconductor device according to claim 1, wherein the opening part of the lead body includes an upwardly inclined slope on the inner periphery.

7. The semiconductor device according to claim 1, wherein
the lead body further includes a first step part that protrudes inward of the opening part from the inner periphery of the opening part,
the bonding component includes a second step part that protrudes outward of the outer peripheral part, and
the first step part and the second step part are bonded by the second bonding material.

8. The semiconductor device according to claim 1, wherein the bonding component has a heat capacity that is smaller than a heat capacity of the lead body.

9. The semiconductor device according to claim 1, wherein the bonding component includes a protruding part on the lower surface.

10. A method for manufacturing a semiconductor device, comprising:
a step of preparing a semiconductor element mounted on a circuit pattern provided on an insulating substrate; and
a step of bonding a lead part having a plate shape to the semiconductor element with a first bonding material interposed between the lead part and the semiconductor element, wherein
the step of bonding the lead part to the semiconductor element includes:
a step of placing the lead body including an opening part such that the opening part corresponds to a mounting position of the semiconductor element;
a step of placing a bonding component in the opening part and on the semiconductor element; and
a step of heating the semiconductor element and the lead part to bond a lower surface of the bonding component to the semiconductor element by the first bonding material and to bond an outer peripheral part of the bonding component to an inner periphery of the opening part by a second bonding material.

11. The method for manufacturing the semiconductor device according to claim 10, wherein
the bonding component in the step of placing the bonding component on the semiconductor element includes the second bonding material on an upper surface of the bonding component, and
the bonding component has wettability to the second bonding material in a center part of the upper surface of the bonding component lower than the wettability to the second bonding material on the outer peripheral part of the bonding component.

12. The method for manufacturing the semiconductor device according to claim 10, wherein the step of bonding the outer peripheral part of the bonding component to the inner periphery of the opening part includes inserting the second bonding material so as to come into contact with a side surface of the outer peripheral part and a side surface of the inner periphery of the opening part.

13. The method for manufacturing the semiconductor device according to claim 10, wherein
the lead body includes a first step part that protrudes inward of the opening part from the inner periphery of the opening part,
the bonding component includes a second step part that protrudes outward of the outer peripheral part,
the bonding component in the step of placing the bonding component includes the second bonding material that is applied in advance to the second step part, and
the step of bonding the outer peripheral part of the bonding component to the inner periphery of the opening part includes bonding the first step part and the second step part by the second bonding material.

\* \* \* \* \*